(12) United States Patent
Farrar

(10) Patent No.: US 7,790,603 B2
(45) Date of Patent: *Sep. 7, 2010

(54) INTEGRATED CIRCUIT INSULATORS AND RELATED METHODS

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/406,532

(22) Filed: Mar. 18, 2009

(65) Prior Publication Data

US 2009/0179331 A1 Jul. 16, 2009

Related U.S. Application Data

(63) Continuation of application No. 11/275,085, filed on Dec. 8, 2005, now Pat. No. 7,521,355.

(51) Int. Cl.
*H01L 21/4763* (2006.01)
*H01L 23/48* (2006.01)

(52) U.S. Cl. ............... 438/624; 438/637; 257/750; 257/752

(58) Field of Classification Search .......... 438/619, 438/622, 624, 625, 629, 637; 257/750, 752, 257/758, 759
See application file for complete search history.

(56) References Cited

U.S. PATENT DOCUMENTS

| | | |
|---|---|---|
| 5,158,986 A | 10/1992 | Cha et al. |
| 5,334,356 A | 8/1994 | Baldwin et al. |
| 5,744,865 A | 4/1998 | Jeng et al. |
| 5,891,797 A | 4/1999 | Farrar |
| 5,994,777 A | 11/1999 | Farrar |
| 6,077,792 A | 6/2000 | Farrar |
| 6,239,019 B1 | 5/2001 | Chiang et al. |
| 6,309,956 B1 | 10/2001 | Chiang et al. |
| 6,318,124 B1 | 11/2001 | Rutherford et al. |

(Continued)

OTHER PUBLICATIONS

Chiniwalla, P., "Structure-Property Relations for Polynorbornenes", *Proceedings from the Eighth Meeting of the Dupont Symposium on Polymides In Microelectronics*, (1998), 615-642.

(Continued)

*Primary Examiner*—Kevin M Picardat
(74) *Attorney, Agent, or Firm*—Schwegman, Lundberg & Woessner, P.A.

(57) ABSTRACT

A system and method for providing low dielectric constant insulators in integrated circuits is provided. One aspect of this disclosure relates to a method for forming an integrated circuit insulator. The method includes forming an insulating layer using a first structural material upon a substrate, the first structural material having sufficient mechanical characteristics to support metal during chemical-mechanical polishing (CMP). The method also includes depositing a metallic layer upon the insulating layer, the metallic layer adapted to be used as a wiring channel. The method further includes processing the metallic layer to form the wiring channel, where processing includes CMP. In addition, the method includes removing and replacing at least a portion of the first structural material with a second structural material, the second structural material having insufficient mechanical characteristics to support metal during CMP. Other aspects and embodiments are provided herein.

20 Claims, 4 Drawing Sheets

U.S. PATENT DOCUMENTS

| | | |
|---|---|---|
| 6,342,454 B1 | 1/2002 | Hawker et al. |
| 6,358,832 B1 | 3/2002 | Edelstein et al. |
| 6,413,854 B1 | 7/2002 | Uzoh et al. |
| 6,551,924 B1 | 4/2003 | Dalton et al. |
| 6,577,011 B1 | 6/2003 | Buchwalter et al. |
| 6,756,297 B2 | 6/2004 | Park |
| 6,838,764 B2 | 1/2005 | Farrar |
| 6,872,671 B2 | 3/2005 | Farrar |
| 6,890,847 B1 | 5/2005 | Farrar |
| 7,214,594 B2 | 5/2007 | Wong et al. |
| 7,276,788 B1 | 10/2007 | Farrar |
| 7,521,355 B2 * | 4/2009 | Farrar .................. 438/624 |
| 2005/0048768 A1 | 3/2005 | Inoue et al. |
| 2006/0261484 A1 | 11/2006 | Farrar |
| 2007/0141832 A1 | 6/2007 | Farrar |
| 2007/0296083 A1 | 12/2007 | Farrar |

OTHER PUBLICATIONS

Jayaraj, K., "Low Dielectric Constant Microcellular Foams", *Proceedings from the Seventh Meeting of the DuPont Symposium on Polymides in Microelectrics*, (Sep. 1996), 474-501.

Miller, R. D., "Low Dielectric Constant Polyimides and Polyimide Nanofoams", *Seventh Meeting of the DuPont Symposium on Polymides in Microelectronics*, (Sep. 1996), 443-473.

Ting, Chiu H., "Low K Material/Process Development", *1996 VLSI Multilevel Interconnection State-of-the-Art Seminar*, (Jun. 1996), 171-212.

\* cited by examiner

INTEGRATED CIRCUIT INSULATORS AND RELATED METHODS

CROSS-REFERENCE TO RELATED APPLICATION(S)

The present application is a continuation of application Ser. No. 11/275,085, filed Dec. 8, 2005 now U.S. Pat. No. 7,521,355, which is incorporated herein by reference in its entirety.

TECHNICAL FIELD

This disclosure relates to semiconductor devices and semiconductor device fabrication, and more particularly, to systems and methods for integrated circuit insulators.

BACKGROUND

Advances in the field of semiconductor manufacturing have decreased the achievable minimum feature size. This decrease in feature size has the undesirable side effect of increasing the capacitive coupling between adjacent devices. As the amount of interconnecting metallurgy increases, the capacitive coupling problem impedes performance. Efforts to minimize the effects of capacitive coupling include isolating wiring into levels with insulators or air gaps between the levels.

Silicon dioxide is a commonly used insulator in the fabrication of integrated circuits. As the density of devices, such as resistors, capacitors and transistors, in an integrated circuit is increased, several problems related to the use of silicon dioxide insulators arise. First, as metal signal carrying lines are packed more tightly, the capacitive coupling between the lines is increased. This increase in capacitive coupling is a significant impediment to achieving high speed information transfer between and among the integrated circuit devices. Silicon dioxide contributes to this increase in capacitive coupling through its dielectric constant, which has a relatively high value of four. Second, as the cross-sectional area of the signal carrying lines is decreased for the purpose of increasing the packing density of the devices that comprise the integrated circuit, the signal carrying lines become more susceptible to fracturing induced by a mismatch between the coefficients of thermal expansion of the silicon dioxide and the signal carrying lines.

One solution to the problem of increased capacitive coupling between signal carrying lines is to use an insulating material that has a lower dielectric constant than silicon dioxide. Polyimide has a dielectric constant of between about 2.8 and 3.5, which is lower than the dielectric constant of silicon dioxide. Using polyimide lowers the capacitive coupling between the signal carrying lines. Unfortunately, there are limits to the extendibility of this solution, since there are a limited number of insulators that have a lower dielectric constant than silicon dioxide and are compatible with integrated circuit manufacturing processes.

One solution to the thermal expansion problem is to use a foamed polymer for the insulating layer. The mismatch between the coefficient of thermal expansion of a metal signal carrying line and the coefficient of thermal expansion of a foamed polymer insulator is less than the mismatch between the coefficient of thermal expansion of a metal signal carrying line and the coefficient of thermal expansion of silicon dioxide. In addition, a foamed polymer will have an effective yield strength which is considerably lower than that of copper. Although these foamed polymers have low dielectric constants, they also have mechanical properties that are not suitable for certain steps of the semiconductor manufacturing process, such as chemical-mechanical polishing (CMP). CMP requires that the insulating layer have sufficient mechanical strength to withstand the polishing forces.

SUMMARY

Disclosed herein, among other things, is a method for providing low dielectric constant insulators in integrated circuits. The method includes applying a first structural material as one or more layers of insulation to an integrated circuit surface. The method also includes processing at least a portion of a metallic wiring level, the metallic wiring level in contact with the first structural material. The method further includes removing and replacing at least some of the first structural material with a second structural material, the second structural material having a lower dielectric constant than the first structural material.

One aspect of this disclosure relates to a method for forming an integrated circuit insulator. The method includes forming an insulating layer using a first structural material upon a substrate, the first structural material having sufficient mechanical characteristics to support metal during chemical-mechanical polishing (CMP). The method also includes depositing a metallic layer upon the insulating layer, the metallic layer adapted to be used as a wiring channel. The method further includes processing the metallic layer to form the wiring channel, where processing includes CMP. In addition, the method includes removing and replacing at least a portion of the first structural material with a second structural material, the second structural material having insufficient mechanical characteristics to support metal during CMP.

An aspect of the method includes forming an insulating structure to insulate copper wires in an integrated circuit chip, where forming the insulating structure includes removing a first structural material and replacing with a polymer of lower dielectric constant during manufacturing of the copper wires.

Another aspect of this disclosure relates to a conductive system having wiring structures with replaced insulators. The system includes a substrate and a foamed material layer on the substrate. The system also includes a plurality of conductive copper structures embedded in the foamed material layer. According to an embodiment, the foamed material layer has replaced a first insulating layer of higher dielectric constant after processing at least a portion of the plurality of copper conductive structures into a wiring level.

One aspect of this disclosure relates to an integrated circuit structure having wiring structures with replaced insulators. The structure includes a substrate and a plurality of stacked foamed polymer layers on the substrate. The system also includes a plurality of copper conductive structures embedded in each of the plurality of foamed polymer layers. According to an embodiment, at least one of the foamed layers has replaced a first insulating layer of higher dielectric constant after processing at least a portion of the plurality of copper conductive structures into a wiring level.

Another aspect of this disclosure relates to a computer system having wiring structures with replaced insulators. The system includes a processor and a memory system coupled to the processor, where the memory system is on a substrate and comprises a plurality of devices. The system also includes an interconnect system including a plurality of stacked foamed polymer layers on the substrate. The interconnect system also includes a plurality of copper conductive structures embedded in each of the plurality of foamed polymer layers. According to an embodiment, at least one of the foamed layers has replaced a first insulating layer of higher dielectric constant after processing at least a portion of the plurality of copper conductive structures into a wiring level.

This Summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present invention is defined by the appended claims and their legal equivalents.

DETAILED DESCRIPTION

Figure 1A:
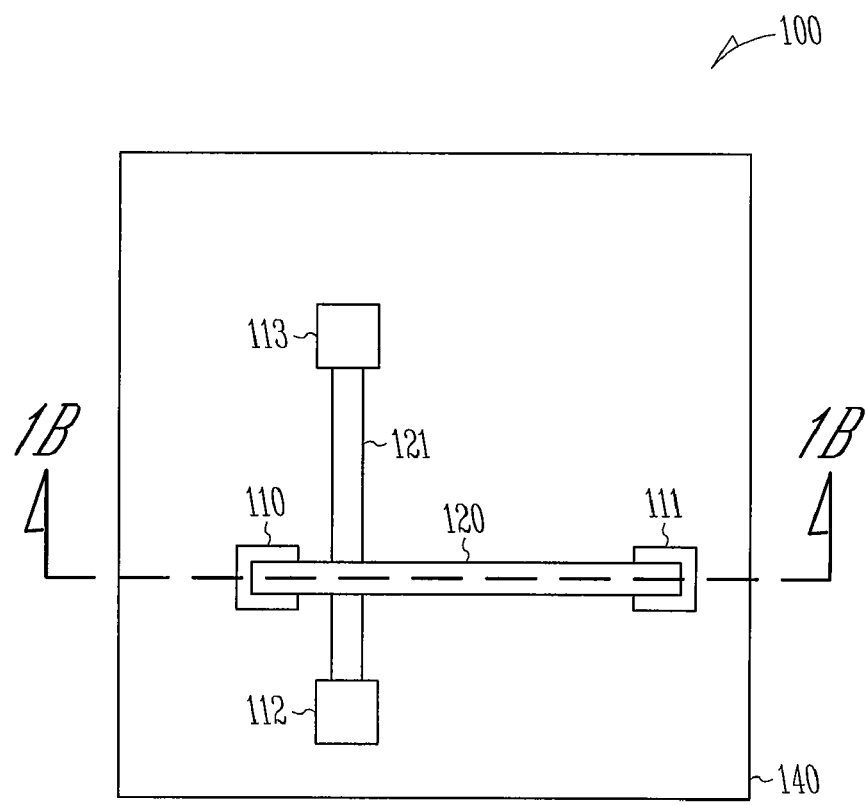
FIGS. 1A-1B illustrate a system with a replaced integrated circuit insulator, according to various embodiments of the present subject matter.

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. Other embodiments may be utilized and structural, logical, and electrical changes may be made without departing from the scope of the present invention. In the following description, the terms "wafer" and "substrate" are used interchangeably to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

Integrated Circuit Insulators

Silicon dioxide is a commonly-used insulator in the fabrication of integrated circuits. As the density of devices, such as resistors, capacitors and transistors, in an integrated circuit is increased, several problems related to the use of silicon dioxide insulators arise. First, as metal signal carrying lines are packed more tightly, the capacitive coupling between the lines is increased. This increase in capacitive coupling is a significant impediment to achieving high speed information transfer between and among the integrated circuit devices. Silicon dioxide contributes to this increase in capacitive coupling through its dielectric constant, which has a relatively high value of four. Second, as the cross-sectional area of the signal carrying lines is decreased for the purpose of increasing the packing density of the devices that comprise the integrated circuit, the signal carrying lines become more susceptible to fracturing induced by a mismatch between the coefficients of thermal expansion of the silicon dioxide and the signal carrying lines.

A solution to the problem of increased capacitive coupling between signal carrying lines is to use an insulating material that has a lower dielectric constant than silicon dioxide. Polyimides have a dielectric constant of between about 2.8 and 3.5, which is lower than the dielectric constant of silicon dioxide, while foamed polymers or other foamed materials will have an even lower dielectric constant than the materials from which they are made. Using polyimides, or other low dielectric materials, lowers the capacitive coupling between the signal carrying lines. Unfortunately, there are limits to the extendibility of this solution, since there are a limited number of insulators that have a lower dielectric constant than silicon dioxide and are compatible with integrated circuit manufacturing processes.

A solution to the thermal expansion problem is to use a foamed polymer for the insulating layer. The mismatch between the coefficient of thermal expansion of a metal signal carrying line and the coefficient of thermal expansion of a foamed polymer insulator is less than the mismatch between the coefficient of thermal expansion of a metal signal carrying line and the coefficient of thermal expansion of silicon dioxide. In addition, a foamed polymer will have an effective yield strength which is considerably lower than that of copper; therefore any thermal stresses will cause a deformation of the foamed material, not of the copper signal carrying lines. Although these foamed polymers have low dielectric constants, they also have mechanical properties that are not suitable for certain steps of the semiconductor manufacturing process, such as chemical-mechanical polishing (CMP). CMP is an integrated circuit manufacturing process involving global planarization of metal and dielectric, and has several benefits. It provides high manufacturing yields, allows for smaller critical dimensions without reducing yield, and is capable of reducing defect density. CMP requires that the insulating layer have sufficient mechanical strength to withstand the polishing forces.

The damascene process which is used for copper metallurgy, specifically, involves first etching the desired metal pattern into an insulator layer, then depositing a layer of copper over the wafer surface. The copper is then polished using CMP to remove the unwanted copper. As stated, CMP requires an insulating material with sufficient mechanical strength to withstand polishing forces. We thus have a situation where the electrical requirements dictate the use of a relatively weak material while the processing requirements dictate the use of a relatively strong material. Therefore, to use copper with a low dielectric insulator (such as a foamed polymer), a new process is required.

What is described herein is a method which can be used to form a wiring structure with a very low dielectric constant insulator, and a resulting system with wiring metal that requires CMP and an insulator which does not support CMP. A first, relatively rigid, material is used to fill the space between wiring channels for the damascene process. The first material is later removed and a second material, with a lower dielectric constant, replaces the first material.

Devices and Systems with Low Dielectric Insulators

Figure 1B:
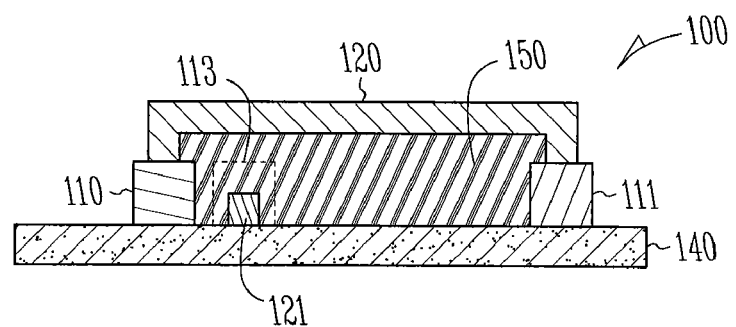

FIGS. 1A-1B illustrate a system with a replaced integrated circuit insulator, according to various embodiments of the present subject matter. FIG. 1A shows a top view of a simple integrated circuit fabricated as a multi-level system, according to one embodiment of the present invention. FIG. 1B shows a side cut-away view of the system of FIG. 1A at line 1B-1B. A conductive system having wiring structures with replaced insulators is depicted. The system 100 includes a substrate 140 and a foamed material layer 150 on the substrate. The system also includes a plurality of conductive copper structures 120, 121 embedded in the foamed material layer. Copper structure 120 couples contacts 110 and 111, while copper structure 121 couples contacts 112 and 113. According to an embodiment, the foamed material layer has replaced a first insulating layer of higher dielectric constant after processing at least a portion of the plurality of copper conductive structures into a wiring level using a chemical-mechanical polishing (CMP) process.

According to various embodiments, the foamed material layer includes a foamed polymer. The foamed polymer has cell size of less than 0.1 micron, according to an embodiment. In various embodiments, the first insulating layer has a dielectric constant of at least 4. The first insulating layer includes $Si_3N_4$ in some embodiments. The first insulating layer includes $SiO_2$ in other embodiments.

One disclosed embodiment relates to an integrated circuit structure having wiring structures with replaced insulators. The structure includes a substrate and a plurality of stacked foamed polymer layers on the substrate. The system also includes a plurality of copper conductive structures embedded in each of the plurality of foamed polymer layers. According to an embodiment, at least one of the foamed layers has replaced a first insulating layer of higher dielectric constant after processing at least a portion of the plurality of copper conductive structures into a wiring level using a chemical-mechanical polishing (CMP) process.

According to various embodiments, each of the stacked foamed polymer layers has a surface that is hydrophobic, and each of the foamed polymer layers has a cell size less than about one micron. At least one of the stacked foamed polymer layers includes a type 1 polyimide, in an embodiment. In one embodiment, at least one of the stacked foamed polymer layers includes polynorbornenes, such as Avatrel. According to an embodiment, at least one of the stacked foamed polymer layers has been treated to make the layer hydrophobic. Hydrophobic treatment may include use of a methane radical to make the layer hydrophobic, according to various embodiments.

Another disclosed embodiment relates to a computer system having wiring structures with replaced insulators. The system includes a processor and a memory system coupled to the processor, where the memory system is on a substrate and comprises a plurality of devices. The system also includes an interconnect system including a plurality of stacked foamed polymer layers on the substrate. The interconnect system also includes a plurality of copper conductive structures embedded in each of the plurality of foamed polymer layers. According to an embodiment, at least one of the foamed layers has replaced a first insulating layer of higher dielectric constant after processing at least a portion of the plurality of copper conductive structures into a wiring level using a chemical-mechanical polishing (CMP) process. It should be obvious to those skilled in the art that other low dielectric materials that have mechanical properties which are incompatible to the processing conditions used in forming the wiring structures can be used in a similar manner.

According to various embodiments, the first insulating layer has sufficient mechanical characteristics to support copper conductive structures during CMP. Each of the stacked foamed polymer layers has insufficient mechanical characteristics to support copper conductive structures during CMP, according to various embodiments. The memory system may include a RAM cell, a ROM cell, a DRAM cell, or other memory configuration, in various embodiments.

Methods for Providing Low Dielectric Insulators

Figure 2A:
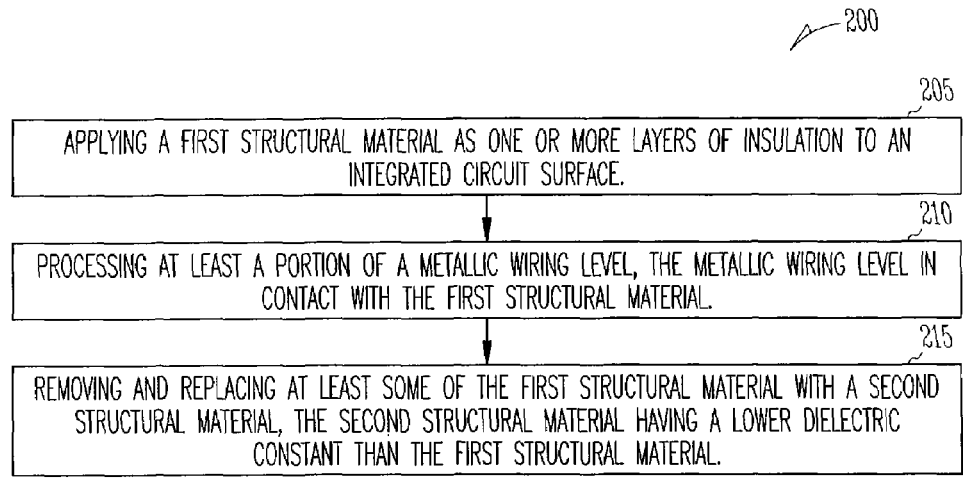
FIGS. 2A-2B illustrate flow diagrams of methods for providing low dielectric insulators in integrated circuits.
Figure 2B:
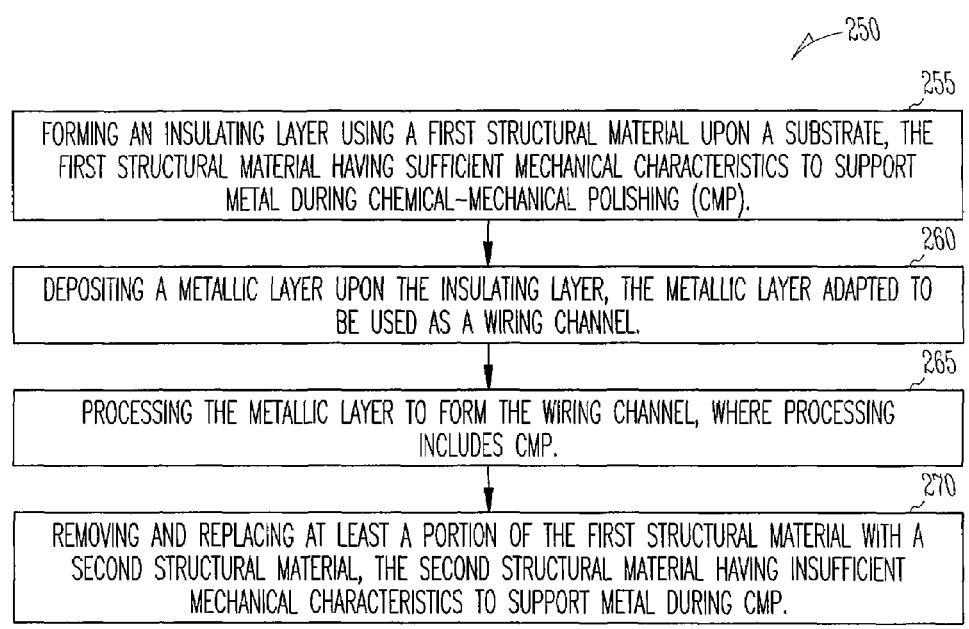

FIGS. 2A-2B illustrate flow diagrams of methods for providing low dielectric insulators in integrated circuits. FIG. 2A depicts a method 200 for providing low dielectric insulators in integrated circuits. The method includes applying a first structural material as one or more layers of insulation to an integrated circuit surface, at 205. The method also includes processing at least a portion of a metallic wiring level, the metallic wiring level in contact with the first structural material, at 210. The method further includes removing and replacing at least some of the first structural material with a second structural material, the second structural material having a lower dielectric constant than the first structural material, at 215.

According to various embodiments of the method, replacing the first insulating material with a second insulating material includes replacing the first insulating material with a polymer. The method of FIG. 2A further includes exposing the integrated circuit surface to methane radicals, according to an embodiment. In addition, exposing the integrated circuit surface to methane radicals includes exposing the integrated circuit surface to methane radicals formed using a high frequency electric field, in an embodiment. According to various embodiments, replacing the first insulating material with a second insulating material includes replacing the first insulating material with a foamed polymer. Processing includes chemical-mechanical polishing (CMP), according to an embodiment. Applying a first insulating material includes applying $Si_3N_4$, according to various embodiments.

According to some embodiments, each wiring level is formed, and then the insulator for that level is replaced. According to other embodiments, all wiring levels are formed, then all levels of insulators are replaced. The replaced insulator is removed using a wet etch, according to various embodiments.

FIG. 2B depicts a method 250 for forming an integrated circuit insulator. The method includes forming an insulating layer using a first structural material upon a substrate, the first structural material having sufficient mechanical characteristics to support metal during chemical-mechanical polishing (CMP), at 255. The method also includes depositing a metallic layer upon the insulating layer, the metallic layer adapted to be used as a wiring channel, at 260. The method further includes processing the metallic layer to form the wiring channel, where processing includes CMP, at 265. In addition, the method includes removing and replacing at least a portion of the first structural material with a second structural material, the second structural material having insufficient mechanical characteristics to support metal during CMP, at 270.

According to an embodiment, removing and replacing at least a portion of the first structural material with a second structural material includes removing and replacing the first structural material with a low dielectric constant organic material, such as Teflon. According to various embodiments, the metallic layer may be made of copper, copper alloy, aluminum, aluminum alloy, silver, gold, or combinations thereof. The first insulating layer may be made of $Si_3N_4$ or $SiO_2$ according to various embodiments.

An aspect of the method includes forming an insulating structure to insulate copper wires in an integrated circuit chip, where forming the insulating structure includes removing a first structural material and replacing with a polymer of lower dielectric constant during manufacturing of the copper wires. According to an embodiment, replacing with a polymer of lower dielectric constant during manufacturing of the copper wires includes replacing with a polymer after CMP processing. The polymer used to replace the first structural material includes a foamed polymer, or polymer foamed using a super critical fluid such as carbon dioxide, in various embodiments. According to an embodiment, forming an insulating structure to insulate copper wires in an integrated circuit chip includes using a dual damascene process.

Another aspect of the method includes constructing an integrated circuit up to the point where a first wiring level is to be formed and then depositing a thickness of a foamed polymer material equal to a thickness of the first wiring level. A thickness of $Si_3N_4$ equal to the thickness of the first wiring level is then deposited, and a resist layer is applied and a pattern etched for the first wiring level in the $Si_3N_4$. A second resist layer is then applied and vias are etched through the foamed polymer material, after which a barrier layer and copper seed layer are deposited. Additional copper is then deposited using electrolytic deposition, and CMP is used to remove excess copper up to the $Si_3N_4$. Selective etching is performed to remove the $Si_3N_4$, a capping layer is deposited, and a layer of foamed polymer is deposited to replace the $Si_3N_4$.

The described process involves replacing a temporary insulator (or mandrel) for each level of metallic wiring. The metal is supported from one side during processing. The process can also be implemented by replacing several levels of mandrel material at once. This can be accomplished if the relative length of the longest wire at each level is such that, when the mandrel material is removed, the amount of sag in the wire is less than that which would cause the wires to tangle or become too close when the final insulator layers are added. It has been shown that the maximum unsupported length of wire in an integrated circuit, for most practical applications, is:

$$L = 32E\,h^2/5p \text{ or } 1.6(E/p)^{1/4}h^{1/2}$$

where L is the unsupported length, E is the modulus of elasticity of the metal conductor, p is the density of the wire, and h is the height, or vertical thickness, of the wire.

As the metal and insulator thickness decrease, the maximum allowable sag will also decrease, as will the maximum free span. Design rules are employed to ensure that the maximum distance between two points to be connected by an unsupported wire during processing is within the allowable range. This is achieved in two ways. First, the wiring and unsupported dimensions are determined and an appropriate safety factor for the wire sag is set. Layout rules are then set to constrain the design so that any two points to be connected by unsupported wire are always closer than the maximum distance. Second, a procedure can be developed to place the devices on a chip layout, determine the maximum required unsupported distance and sag safety factor, and then determine the wire and insulator thickness necessary for each level. An alternate method would be to provide intermediate support for longer wires so their use would not necessitate any additional constraints on the layout.

Wafer Level

Figure 3:
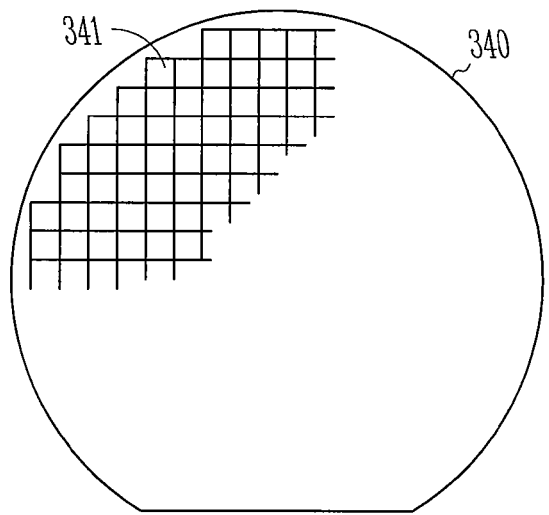
FIG. 3 illustrates a wafer, upon which wiring structures with replaced insulators can be fabricated according to embodiments of the present subject matter.

FIG. 3 illustrates a wafer 340, upon which wiring structures with replaced insulators can be fabricated according to embodiments of the present subject matter. A common wafer size is 8 inches in diameter. However, wafers are capable of being fabricated in other sizes, and the present subject matter is not limited to wafers of a particular size. A number of dies can be formed on a wafer. A die 341 is an individual pattern, typically rectangular, on a substrate that contains circuitry to perform a specific function. A semiconductor wafer typically contains a repeated pattern of such dies containing the same functionality. A die is typically packaged in a protective casing (not shown) with leads extending therefrom (not shown) providing access to the circuitry of the die for communication and control.

System Level

Figure 4:
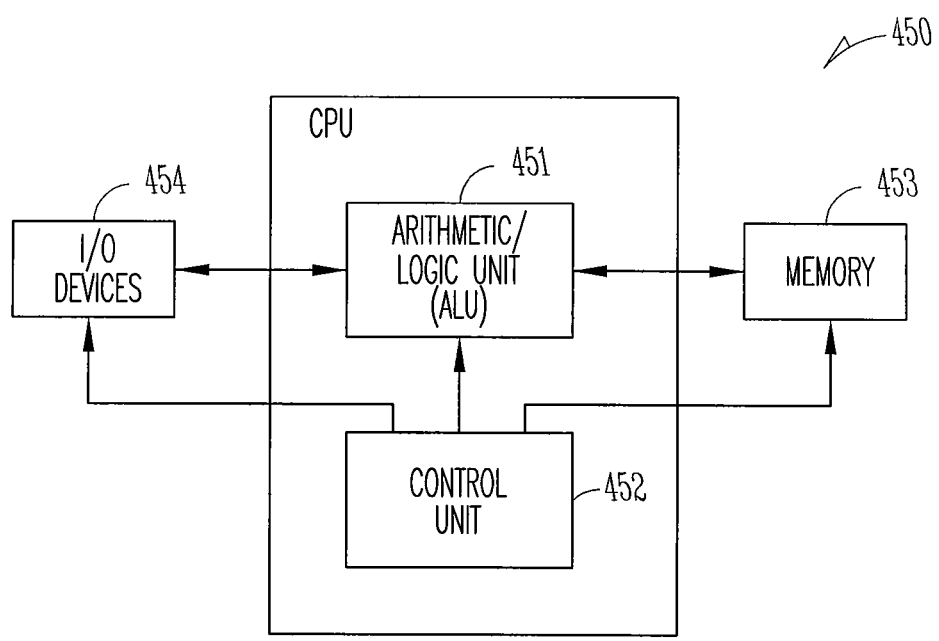
FIG. 4 illustrates a simplified block diagram of a high-level organization of an electronic system that includes wiring structures with replaced insulators, according to various embodiments.

FIG. 4 illustrates a simplified block diagram of a high-level organization of an electronic system that includes wiring structures with replaced insulators, according to various embodiments. In various embodiments, the system 450 is a computer system, a process control system or other system that employs a processor and associated memory. The electronic system 450 has functional elements, including a processor or arithmetic/logic unit (ALU) 451, a control unit 452, a memory device unit 453 and an input/output (I/O) device or devices 454. Generally such an electronic system 450 will have a native set of instructions that specify operations to be performed on data by the processor 451 and other interactions between the processor 451, the memory device unit 453 and the I/O devices 454. The control unit 452 coordinates all operations of the processor 451, the memory device 453 and the I/O devices 454 by continuously cycling through a set of operations that cause instructions to be fetched from the memory device 453 and executed. According to various embodiments, the memory device 453 includes, but is not limited to, random access memory (RAM) devices, read-only memory (ROM) devices, and peripheral devices such as a floppy disk drive and a compact disk CD-ROM drive. As one of ordinary skill in the art will understand upon reading and comprehending this disclosure, any of the illustrated electrical components are capable of being fabricated to include wiring structures with replaced insulators in accordance with the present subject matter.

Figure 5:
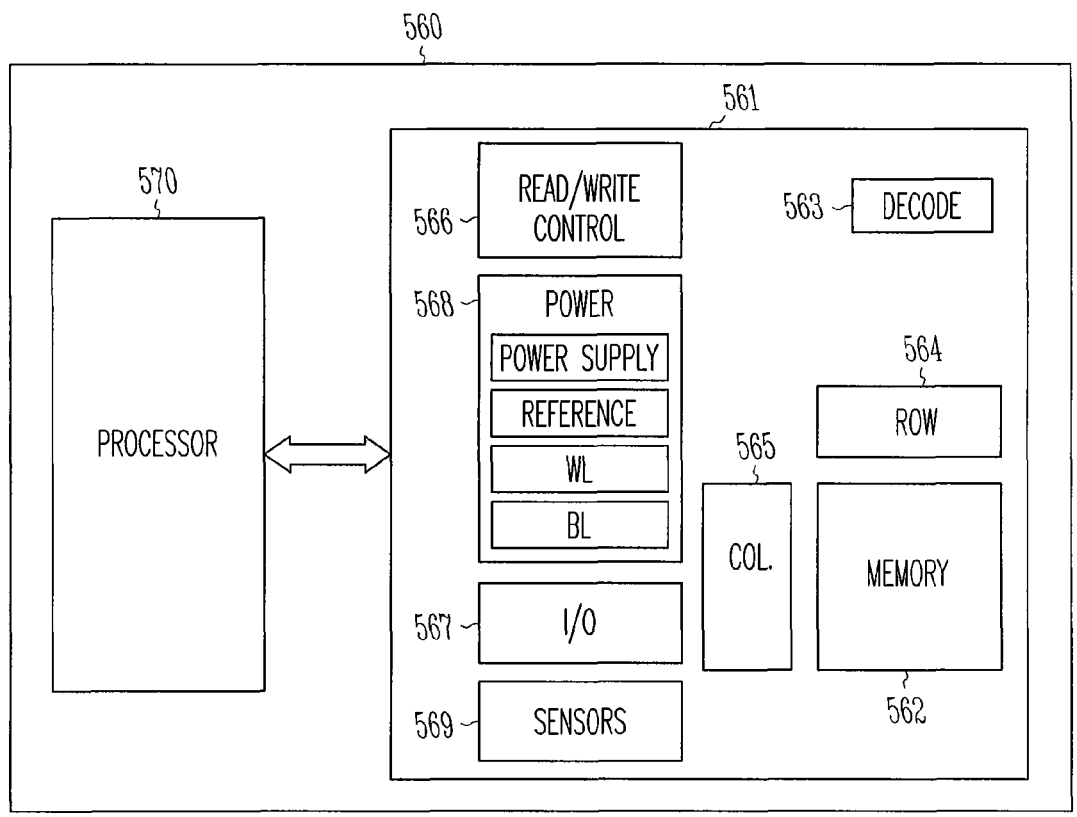
FIG. 5 illustrates a simplified block diagram of a high-level organization of an electronic system that includes transistors wiring structures with replaced insulators, according to various embodiments.

FIG. 5 illustrates a simplified block diagram of a high-level organization of an electronic system that includes wiring structures with replaced insulators, according to various embodiments. The system 560 includes a memory device 561 which has an array of memory cells 562, address decoder 563, row access circuitry 564, column access circuitry 565, read/write control circuitry 566 for controlling operations, and input/output circuitry 567. The memory device 561 further includes power circuitry 568, and sensors 569 for determining the state of the memory cells. The illustrated power circuitry 568 includes power supply circuitry, circuitry for providing a reference voltage, circuitry for providing the word line with pulses, and circuitry for providing the bit line with pulses. Also, as shown in FIG. 5, the system 560 includes a processor 570, or memory controller for memory accessing. The memory device receives control signals from the processor over wiring or metallization lines. The memory device is used to store data which is accessed via I/O lines. It will be appreciated by those skilled in the art that additional circuitry and control signals can be provided, and that the memory device has been simplified. At least one of the processor or memory device includes the wiring structures with replaced insulators according to the present subject matter.

The illustration of system 560, as shown in FIG. 5, is intended to provide a general understanding of one application for the structure and circuitry of the present subject matter, and is not intended to serve as a complete description of all the elements and features of an electronic system. As one of ordinary skill in the art will understand, such an electronic system can be fabricated in single-package processing units, or even on a single semiconductor chip, in order to reduce the communication time between the processor and the memory device.

Applications containing wiring structures with replaced insulators, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A system, comprising:
  a substrate;
  a hydrophobic material layer on the substrate; and
  a plurality of conductive copper structures embedded in the material layer;
  wherein the hydrophobic material layer has replaced a first insulating layer of higher dielectric constant after processing at least a portion of the plurality of copper conductive structures into a wiring level.

2. The system of claim 1, wherein the hydrophobic material layer includes a foamed polymer.

3. The system of claim 2, wherein the foamed polymer has cell size of less than 0.1 micron.

4. The system of claim 1, wherein the first insulating layer has a dielectric constant of at least 4.

5. The system of claim 1, wherein the first insulating layer includes $Si_3N_4$.

6. The system of claim 1, wherein the first insulating layer includes $SiO_2$.

7. An system, comprising:
  a substrate;
  a plurality of stacked hydrophobic foamed polymer layers on the substrate; and
  a plurality of copper conductive structures embedded in each of the plurality of foamed polymer layers;
  wherein at least one of the foamed layers has replaced a first insulating layer of higher dielectric constant after processing at least a portion of the plurality of copper conductive structures into a wiring level.

8. The system of claim 7, wherein each of the foamed polymer layers has a cell size less than about one micron.

9. The system of claim 7, wherein at least one of the stacked foamed polymer layers includes a type 1 polyimide.

10. The system of claim 7, wherein at least one of the stacked foamed polymer layers includes polynorbornenes.

11. The system of claim 10, wherein the polynorbornenes include Avatrel.

12. The system of claim 7, wherein at least one of the stacked foamed polymer layers has been treated with a methane radical to make the layer hydrophobic.

13. A method, comprising:
  forming an insulating layer using a first structural material upon a substrate;
  depositing a metallic layer upon the insulating layer, the metallic layer adapted to be used as a wiring channel;
  processing the metallic layer to form the wiring channel; and
  removing and replacing at least a portion of the first structural material with a second structural material, the second structural material having been treated with a methane radical to make the second structural material hydrophobic.

14. The method of claim 13, wherein removing and replacing at least a portion of the first structural material with a second structural material includes removing and replacing the first structural material with a low dielectric constant organic material.

15. The method of claim 14, wherein removing and replacing at least a portion of the first structural material with a second structural material includes removing and replacing the first structural material with Teflon.

16. The method of claim 13, wherein depositing a metallic layer upon the insulating layer includes depositing copper.

17. The method of claim 13, wherein depositing a metallic layer upon the insulating layer includes depositing aluminum.

18. The method of claim 13, wherein depositing a metallic layer upon the insulating layer includes depositing silver.

19. The method of claim 13, wherein depositing a metallic layer upon the insulating layer includes depositing gold.

20. The method of claim 13, wherein removing and replacing at least a portion of the first structural material with a second structural material includes replacing the first structural material with a foamed polymer.

* * * * *